United States Patent
Huang

(10) Patent No.: US 8,471,743 B2
(45) Date of Patent: Jun. 25, 2013

(54) QUANTIZATION CIRCUIT HAVING VCO-BASED QUANTIZER COMPENSATED IN PHASE DOMAIN AND RELATED QUANTIZATION METHOD AND CONTINUOUS-TIME DELTA-SIGMA ANALOG-TO-DIGITAL CONVERTER

(75) Inventor: Sheng-Jui Huang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 107 days.

(21) Appl. No.: 13/189,568

(22) Filed: Jul. 25, 2011

(65) Prior Publication Data

US 2012/0112936 A1  May 10, 2012

Related U.S. Application Data

(60) Provisional application No. 61/410,226, filed on Nov. 4, 2010.

(51) Int. Cl.
*H03M 3/00* (2006.01)
(52) U.S. Cl.
USPC .......................................... 341/143; 341/155
(58) Field of Classification Search
USPC .......... 341/143, 155, 156, 120, 172; 327/159, 327/105, 261
See application file for complete search history.

(56) References Cited

U.S. PATENT DOCUMENTS

| 5,552,727 | A  | * | 9/1996  | Nakao .......................... 327/159 |
| 7,120,584 | B2 | * | 10/2006 | Sheikhzadeh-Nadjar et al. ............................. 704/266 |
| 7,629,916 | B2 | * | 12/2009 | Wiesbauer et al. ........... 341/166 |

OTHER PUBLICATIONS

Mitteregger, "A 20-mW 640-MHz CMOS Continuous-Time Sigma-Delta ADC With 20-MHz Signal Bandwidth, 80-dB Dynamic Range and 12-bit ENOB", IEEE Journal of Solid-State Circuits, pp. 2641-2649, Vol. 41, No. 12, Dec. 2006.
Crombez, "A Single-Bit 500 kHz-10 MHz Multimode Power-Performance Scalable 83-to-67 dB DR CT Delta-Sigma for SDR in 90nm Digital CMOS", IEEE Journal of Solid-State Circuits, pp. 1159-1171, Vol. 45, No. 6, Jun. 2010.
Park, "A 78 dB SNDR 87 mW 20 MHz Bandwidth Continuous-Time Delta-Sigma ADC With VCO-Based Integrator and Quantizer Implemented in 0.13 um CMOS", IEEE Journal of Solid-State Circuits, pp. 3344-3358, Vol. 44, No. 12, Dec. 2009.

* cited by examiner

*Primary Examiner* — Joseph Lauture
(74) *Attorney, Agent, or Firm* — Winston Hsu; Scott Margo

(57) ABSTRACT

A quantization circuit includes a quantizer and a compensation circuit. The quantizer includes a voltage-to-phase converter and a phase difference digitization block. The voltage-to-phase converter is arranged for generating a phase signal according to an input voltage. The phase difference digitization block is arranged for generating a quantization output according to a phase difference between a phase of the phase signal and a reference phase input. The compensation circuit is arranged for applying compensation to the phase difference digitization block according to the quantization output.

18 Claims, 10 Drawing Sheets

Subtraction

Addition

FIG. 7A Subtraction

FIG. 7B Addition

FIG. 9A

Subtraction

XOR PD output

FIG. 9B

Addition

XOR PD output

QUANTIZATION CIRCUIT HAVING VCO-BASED QUANTIZER COMPENSATED IN PHASE DOMAIN AND RELATED QUANTIZATION METHOD AND CONTINUOUS-TIME DELTA-SIGMA ANALOG-TO-DIGITAL CONVERTER

CROSS REFERENCE TO RELATED APPLICATIONS

This application claims the benefit of U.S. provisional application No. 61/410,226, filed on Nov. 4, 2010 and incorporated herein by reference.

BACKGROUND

The disclosed embodiments of the present invention relate to signal processing with quantization involved therein, and more particularly, to a quantization circuit having a VCO-based quantizer compensated in a phase domain and related quantization method and continuous-time delta-sigma analog-to-digital converter.

Delta-sigma analog-to-digital converters have become very popular because they overcome some of inherent problems of conventional analog-to-digital converters. Conventional analog-to-digital converters favorably sample at the lowest sampling frequency, but inconveniently require highly accurate analog circuitry. In contrast, the delta-sigma analog-to-digital converters relax the requirements on analog circuitry. This benefit is gained at the tolerable expense of higher sampling frequency and more stringent digital signal processing. By over-sampling the input signal, applying coarse quantization and shaping the quantization noise spectrum, the delta-sigma analog-to-digital converters can provide high resolution in a relative small bandwidth.

Most often, the delta-sigma analog-to-digital converters are implemented with the use of discrete topologies. However, the input bandwidth is limited by the speed at which the loop filter can operate. The use of the continuous-time delta-sigma analog-to-digital converters provides some improvements. The advantage lies in the fact that no sampling is performed within the filter, so the restriction of the maximum sampling frequency is only imposed on the sampler within the quantizer. However, the continuous-time delta-sigma analog-to-digital converter exhibits several non-idealities, such as excess loop delay. Ideally, the digital-to-analog converter (DAC) disposed at the feedback path should respond immediately to the quantizer clock edge. Actually, the non-zero transistor switching time of the quantizer and the DAC results in a finite delay between the quantizer and the DAC, leading to the unwanted excess loop delay. As the timing errors are continuously accumulated at the integrator through the feedback DAC, the overall signal and noise transfer function of the continuous-time delta-sigma analog-to-digital converter is shifted from the desired one. Thus, there is a need for a compensation scheme of the excess loop delay existing in the continuous-time delta-sigma analog-to-digital converter.

SUMMARY

In accordance with exemplary embodiments of the present invention, a quantization circuit having a VCO-based quantizer compensated in a phase domain and related quantization method and continuous-time delta-sigma analog-to-digital converter are proposed to solve the above-mentioned problem.

According to a first aspect of the present invention, an exemplary quantization circuit is disclosed. The exemplary quantization circuit includes a quantizer and a compensation circuit. The quantizer includes a voltage-to-phase converter and a phase difference digitization block. The voltage-to-phase converter is arranged for generating a phase signal according to an input voltage. The phase difference digitization block is arranged for generating a quantization output according to a phase difference between a phase of the phase signal and a reference phase input. The compensation circuit is arranged for applying compensation to the phase difference digitization block according to the quantization output.

According to a second aspect of the present invention, an exemplary quantization method is disclosed. The exemplary quantization method includes: utilizing a quantizer for generating a quantization output of an input voltage, comprising generating a phase signal according to the input voltage and generating the quantization output according to a phase difference between a phase of the phase signal and a reference phase input by performing a phase difference digitization; and applying compensation to the phase difference digitization according to the quantization output.

According to a third aspect of the present invention, an exemplary continuous-time delta-sigma analog-to-digital converter is disclosed. The exemplary continuous-time delta-sigma analog-to-digital converter includes an adder, a loop filter, a quantizer, an excess loop delay compensation circuit, and a digital-to-analog converter. The adder is arranged for subtracting a feedback signal from an analog input signal. The loop filter is arranged for generating an input voltage according to an output of the adder. The quantizer includes a voltage-to-phase converter and a phase difference digitization block. The voltage-to-phase converter is arranged for generating a phase signal according to the input voltage. The phase difference digitization block is arranged for generating a quantization output according to a phase difference between a phase of the phase signal and a reference phase input. The excess loop delay compensation circuit is arranged for applying excess loop delay compensation to the phase difference digitization block according to the quantization output. The digital-to-analog converter is arranged for generating the feedback signal according to the quantization output.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7A is a diagram illustrating an exemplary subtraction in the phase domain for adjusting the original XOR PD output shown in FIG. 6.

FIG. 7B is a diagram illustrating an exemplary addition in the phase domain for adjusting the original XOR PD output shown in FIG. 6.

FIG. 9A is a diagram illustrating an exemplary subtraction in the phase domain for adjusting the original XOR PD output shown in FIG. 8.

FIG. 9B is a diagram illustrating an exemplary addition in the phase domain for adjusting the original XOR PD output shown in FIG. 8.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

As mentioned above, the DAC disposed at the feedback path of the continuous-time delta-sigma analog-to-digital converter should respond immediately to the quantizer clock edge, ideally. However, there is a finite delay between the quantizer and the DAC, leading to the unwanted excess loop delay that corrupts the desired response of the path at which the loop filter and the quantizer are disposed (i.e., the overall signal and noise transfer function of the continuous-time delta-sigma analog-to-digital converter would be different from the desired one). Thus, the response of the path at which the loop filter and the quantizer are disposed should be properly tuned based on the amount of the excess loop delay, which necessitates the excess loop delay compensation. To put it simply, the excess loop delay compensation added to the continuous-time delta-sigma analog-to-digital converter is capable of altering the corrupted signal and noise transfer function to regain the proper one. By way of example, in an exemplary application such as a continuous-time delta-sigma analog-to-digital converter, an exemplary compensation scheme of the present invention is employed for applying the excess loop delay compensation to a quantization circuit. Further details directed to the exemplary compensation scheme of the present invention are described hereinafter.

Figure 1:
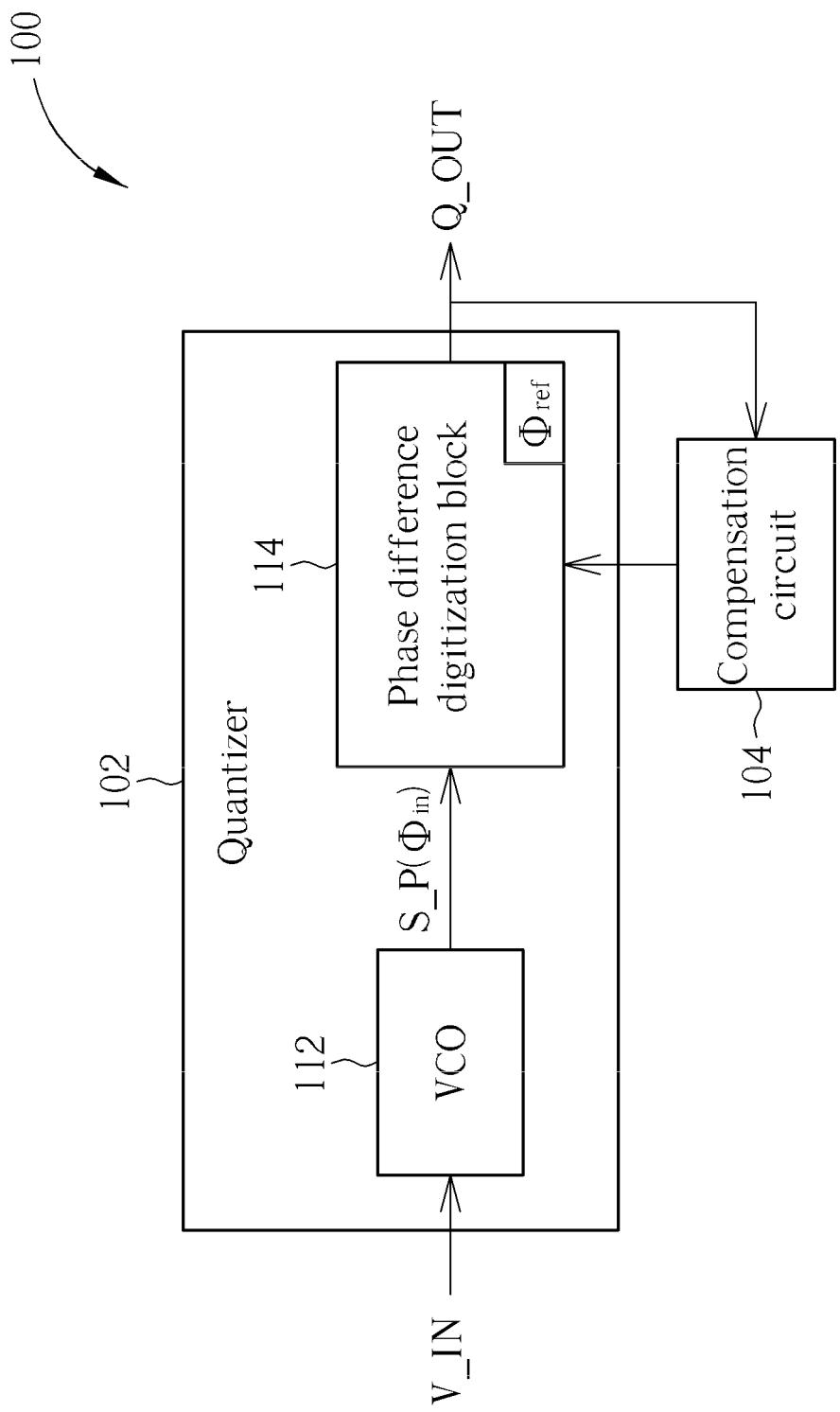
FIG. 1 is a diagram illustrating a quantization circuit according to an exemplary embodiment of the present invention.

FIG. 1 is a diagram illustrating a quantization circuit according to an exemplary embodiment of the present invention. The exemplary quantization circuit 100 includes, but is not limited to, a quantizer 102 and a compensation circuit 104. In this exemplary embodiment, the quantizer 102 includes a voltage-to-phase converter, such as a voltage-controlled oscillator (VCO) 112 for example, and a phase difference digitization block 114. In other words, the quantizer 102 is a VCO-based quantizer. The VCO 112 is arranged for integrating an input voltage V_IN into a phase signal S_P which carries phase information associated with the input voltage V_IN. The phase difference digitization block 114 is coupled to the VCO 112, and arranged for generating a quantization output Q_OUT according to a phase difference between a phase input $\phi_{in}$ of the phase signal S_P and a reference phase input $\phi_{ref}$. The compensation circuit 104 is coupled to the phase difference digitization block 114, and arranged for receiving the quantization output Q_OUT and applying compensation to the phase difference digitization block 114 according to the quantization output Q_OUT. For example, the compensation circuit 104 refers to the quantization output Q_OUT to adjust the reference phase input $\phi_{ref}$, thereby applying the required compensation to the phase difference digitization block 114. However, this is for illustrative purposes only, and is not meant to be a limitation of the present invention. For example, any compensation scheme which compensates the quantizer in the phase domain falls within the scope of the present invention.

Figure 2:
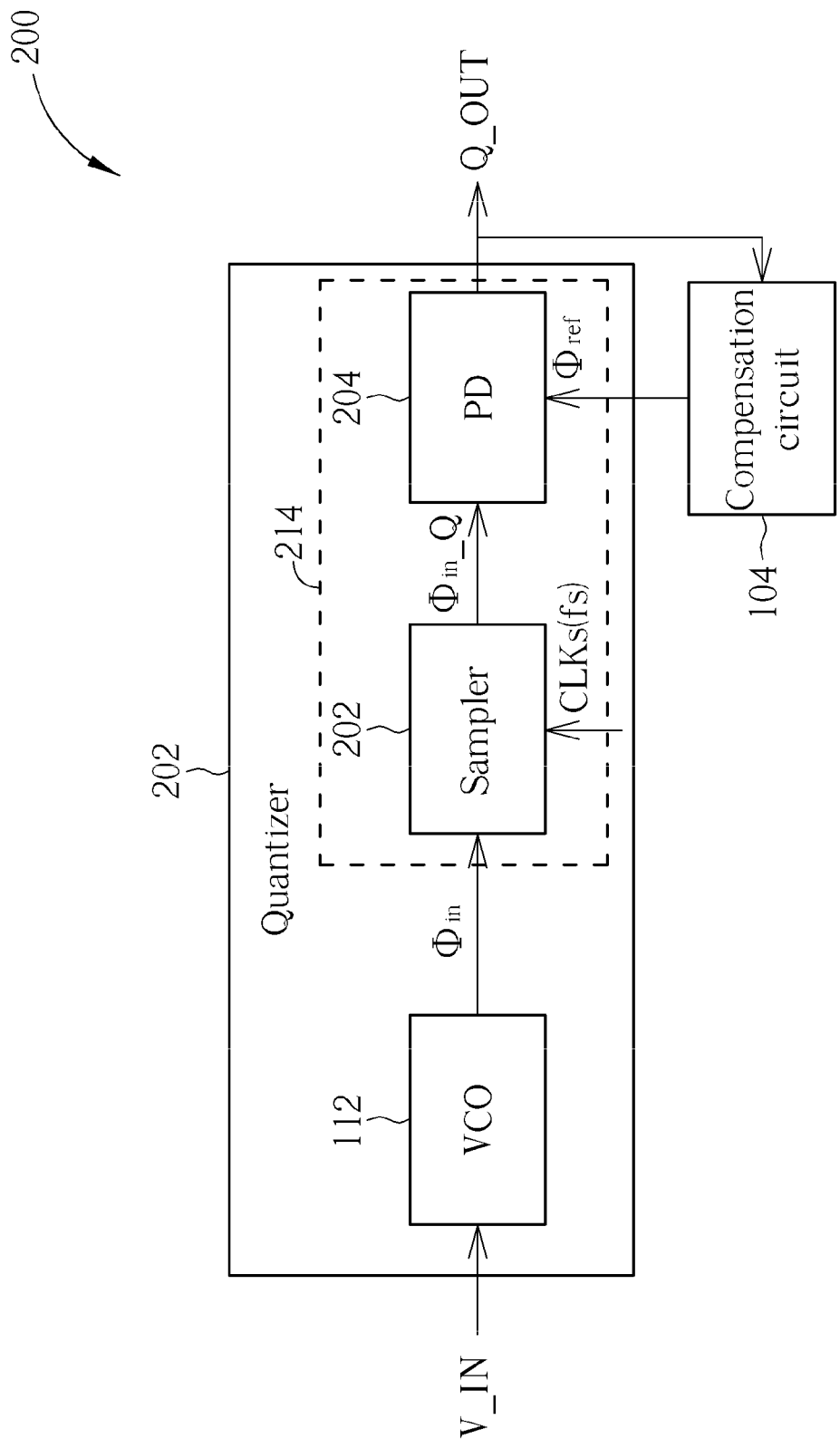
FIG. 2 is a diagram illustrating a first exemplary implementation of the quantization circuit shown in FIG. 1.

Please refer to FIG. 2, which is a diagram illustrating a first exemplary implementation of the quantization circuit 100. The quantization circuit 200 is based on the circuit structure of the quantization circuit 100 shown in FIG. 1, and therefore includes a quantizer 202 and the aforementioned compensation circuit 104. In this exemplary embodiment, the quantizer 202 includes the aforementioned VCO 112 and a phase difference digitization block 214 realized by a combination of a sampler 202 and a phase detector (PD) 204. The sampler 202 is arranged for sampling the phase input $\phi_{in}$ of the phase signal S_P by using a sampling clock CLKs with a sampling frequency $f_s$, and accordingly generating a quantized phase input $\phi_{in\_Q}$ to the following PD 204. The phase detector 204 is coupled to the sampler 202, and arranged for generating the quantization output Q_OUT by comparing the quantized phase input $\phi_{in\_Q}$ and the reference phase input $\phi_{ref}$. In this exemplary implementation, the compensation circuit 104 is implemented for adjusting the reference phase input $\phi_{ref}$ used by the PD 204 to achieve the objective of applying compensation to the phase difference digitization block 214.

As mentioned above, the phase difference digitization block 114 is utilized for generating the quantization output Q_OUT according to the phase difference between the phase input $\phi_{in}$ and the reference phase input $\phi_{ref}$. Thus, any circuit capable of achieving the intended functionality may be employed for realizing the phase difference digitization block 114. Please refer to FIG. 3, which is a diagram illustrating a second exemplary implementation of the quantization circuit 100. The quantization circuit 300 is also based on the circuit structure of the quantization circuit 100 shown in FIG. 1, and includes a quantizer 302 and the aforementioned compensation circuit 104. In this exemplary embodiment, the quantizer 302 includes the aforementioned VCO 112 and a phase difference digitization block realized by a time-to-digital converter (TDC) 314. The TDC 314 receives the phase signal S_P with the phase input $\phi_{in}$ and a reference clock signal $CLK_{ref}$ with the reference phase input $\phi_{ref}$, and converts a timing difference (e.g., a timing difference corresponding to a phase difference between the reference clock signal $CLK_{ref}$ and the phase signal S_P) into a digital representation which serves as the quantization output Q_OUT. As a person skilled in the art should readily understand the principle of the TDC 314, further description is omitted here for brevity. Please note that, in this exemplary embodiment, the compensation circuit 104 is implemented for adjusting the reference phase input $\phi_{ref}$ of the reference clock signal $CLK_{ref}$ needed by the TDC 314 to achieve the objective of applying compensation to the phase difference digitization block.

Figure 4:
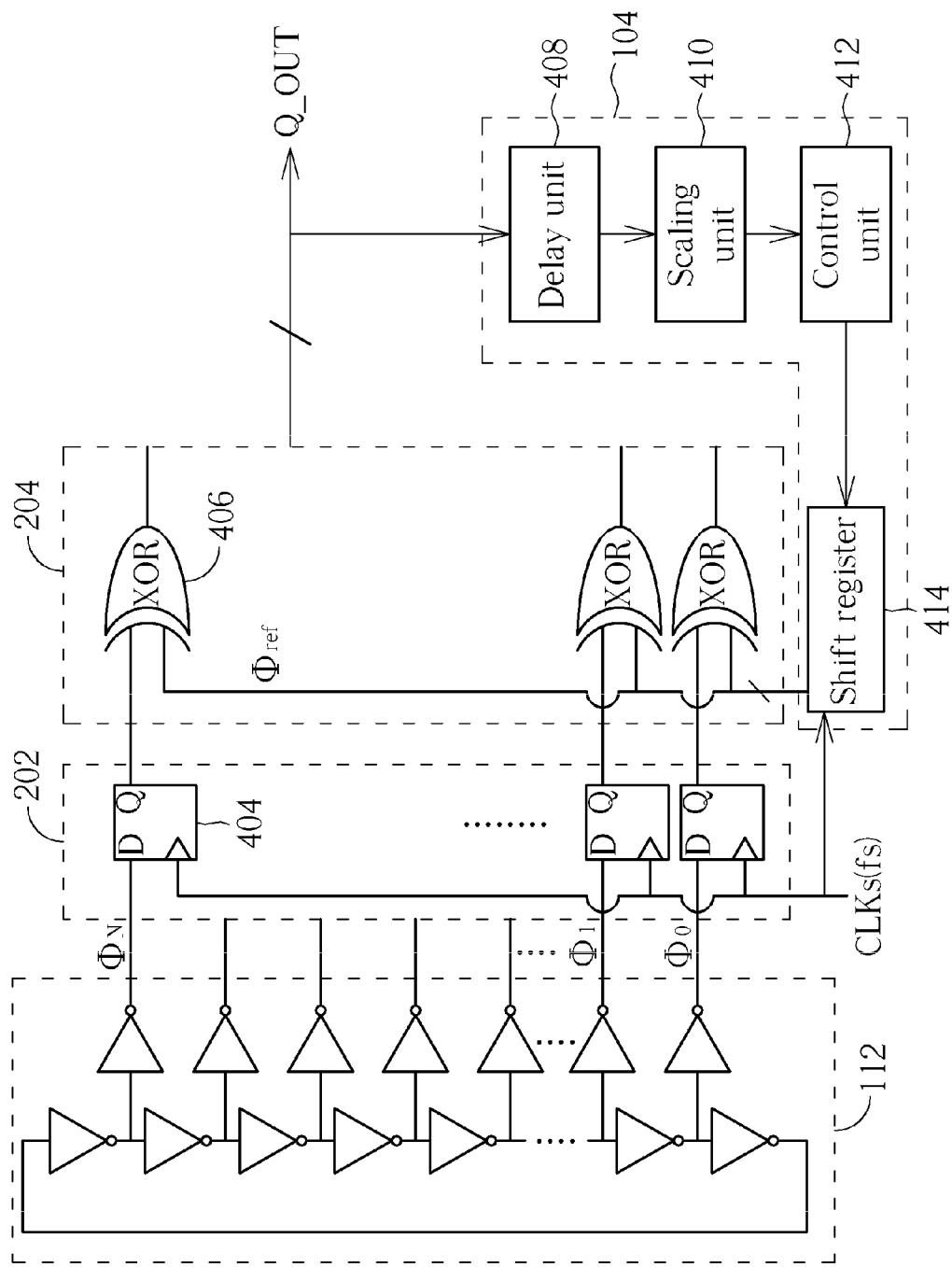
FIG. 4 is a circuit diagram of the quantization circuit shown in FIG. 2.

To more clearly describe technical features of the present invention, in the following, the exemplary circuit structure shown in FIG. 2 is used as an example. Please refer to FIG. 4, which is a circuit diagram of an exemplary implementation of the quantization circuit 200 shown in FIG. 2. As shown in the figure, the VCO 112 is implemented by a ring oscillator composed of a plurality of inverters/buffers 402. Thus, the phase input $\phi_{in}$ includes a plurality of phases $\phi_1$-$\phi_n$ due to multi-phase clocks generated from the ring oscillator. The sampler 202 is implemented by a D-type flip-flop bank composed of a plurality of D-type flip-flops 404 each triggered by the sampling clock CLKs with the sampling frequency $f_s$. The PD 204 is implemented by an XOR PD composed of a plurality of XOR gates 406, and utilized for performing an XOR logic operation upon a bit sequence including bits respectively generated from the D-type flip-flops 404 and a bit sequence representative of the reference phase input $\phi_{ref}$ to thereby generate an XOR PD output acting as the quantization output Q_OUT. As shown in FIG. 4, the compensation circuit 104 includes a delay unit 408, a scaling unit 410, a control unit 412, and a shift register 414. The delay unit 408 is arranged to apply a predetermined delay amount, such as a half sampling period delay (i.e., $0.5*T_s$, where $T_s$ is the period of the sampling clock $CLK_s$), to the quantization output Q_OUT. The scaling unit 410 is arranged to adjust the actual compensation applied to the reference phase input $\phi_{ref}$ by scaling the output of the delay unit 408 (i.e., the delayed quantization output Q_OUT).

In this exemplary design, the compensation circuit 104 adjusts the reference phase input $\phi_{ref}$ by bit-shifting the bit sequence of the reference phase input $\phi_{ref}$ according to the quantization output Q_OUT. As shown in the figure, the bit sequence of the reference phase input $\phi_{ref}$ is stored and provided by the shift register 414, and the control unit 412 determines the shift control by referring to an output of the scaling unit 410 (i.e., a scaled version of the delayed quantization output Q_OUT), and applies the shift control upon the shift register 414 to shift the bits stored in the shift register 414 upwards/downwards and effectively perform addition/subtraction.

Figure 5A:
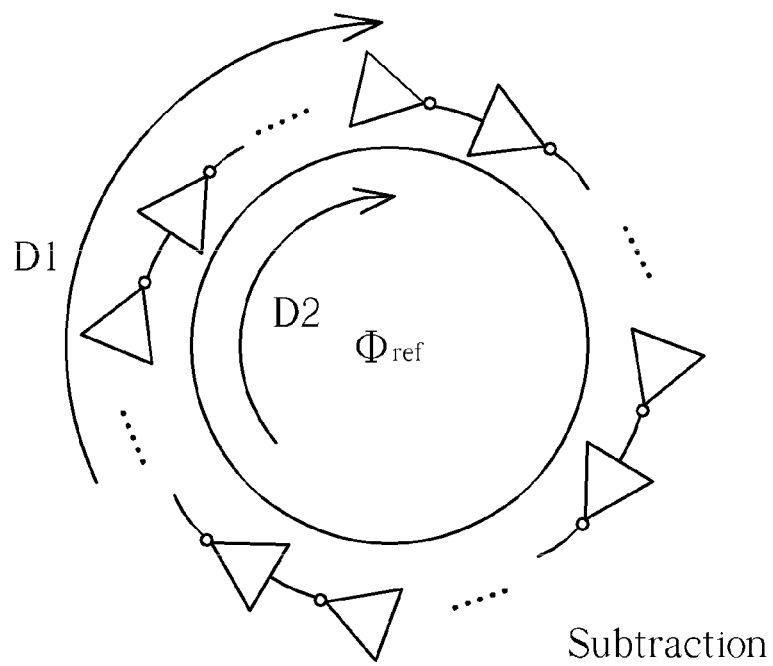
FIG. 5A is a diagram illustrating a subtraction in the phase domain.
Figure 5B:
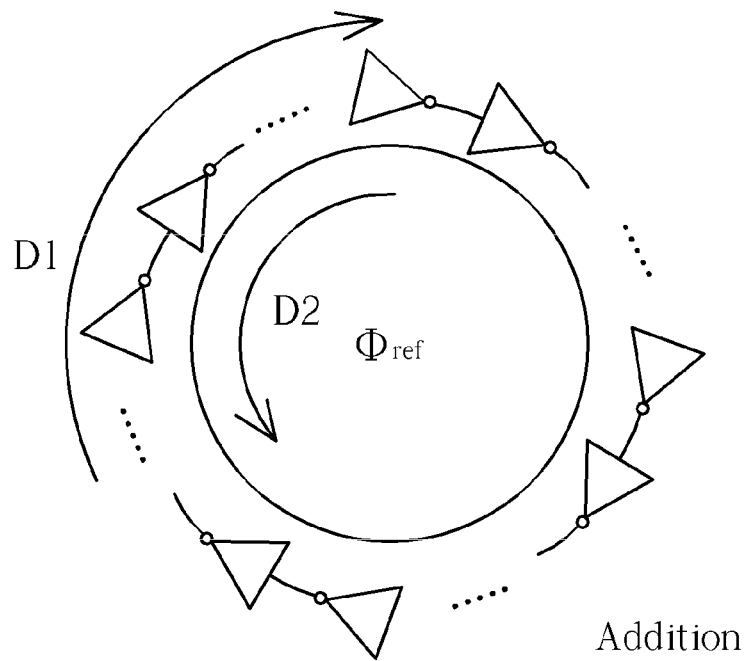
FIG. 5B is a diagram illustrating an addition in the phase domain.

Please refer to FIG. 5A and FIG. 5B. FIG. 5A is a diagram illustrating a subtraction in the phase domain. FIG. 5B is a diagram illustrating an addition in the phase domain. The reference phase input $\phi_{ref}$ is referenced for measuring how many inverter stages are progressed by clock edges of multi-phase clocks generated from the ring oscillator. Thus, when the bit-shifting direction D2 of the reference phase input $\phi_{ref}$ is identical to an edge propagation direction D1 of the phase signal, the number of inverter stages progressed by clock edges (i.e., the difference between the phase input $\phi_{in}$ of the phase signal and the reference phase input $\phi_{ref}$) is reduced, resulting in a subtraction in the phase domain. When the bit-shifting direction D2 of the reference phase input $\phi_{ref}$ is opposite to the edge propagation direction D1 of the phase signal, the number of inverter stages progressed by clock edges (i.e., the difference between the phase input $\phi_{in}$ of the phase signal and the reference phase input $\phi_{ref}$) is increased, resulting in an addition in the phase domain. To put it another way, with a correct bit-shifting setting of the shift register 414, the PD 204 is properly compensated in the phase domain without adjusting/changing outputs of the preceding sampler 202.

By way of example, but not limitation, the quantization output Q_OUT is a thermometer code, and would be converted into a signed number. Therefore, the control unit 412 determines whether an addition or a subtraction in the phase domain is enabled through checking the sign bit. For example, when the signed number is a negative number, the compensation circuit 104 may enable a subtract in the phase domain by reducing the phase difference between the phase input $\phi_{in}$ of the phase signal and the reference phase input $\phi_{ref}$ through adjusting the reference phase input $\phi_{ref}$ in a bit-shifting direction identical to an edge propagation direction of the phase signal (i.e., an edge propagation direction of multi-phase clocks generated from the ring oscillator). When the signed number is a positive number, the compensation circuit 104 may enable an addition in the phase domain by increasing the phase difference between the phase input of the phase signal and the reference phase input through adjusting the reference phase input in a bit-shifting direction opposite to an edge propagation direction of the phase signal (i.e., an edge propagation direction of multi-phase clocks).

Figure 6:
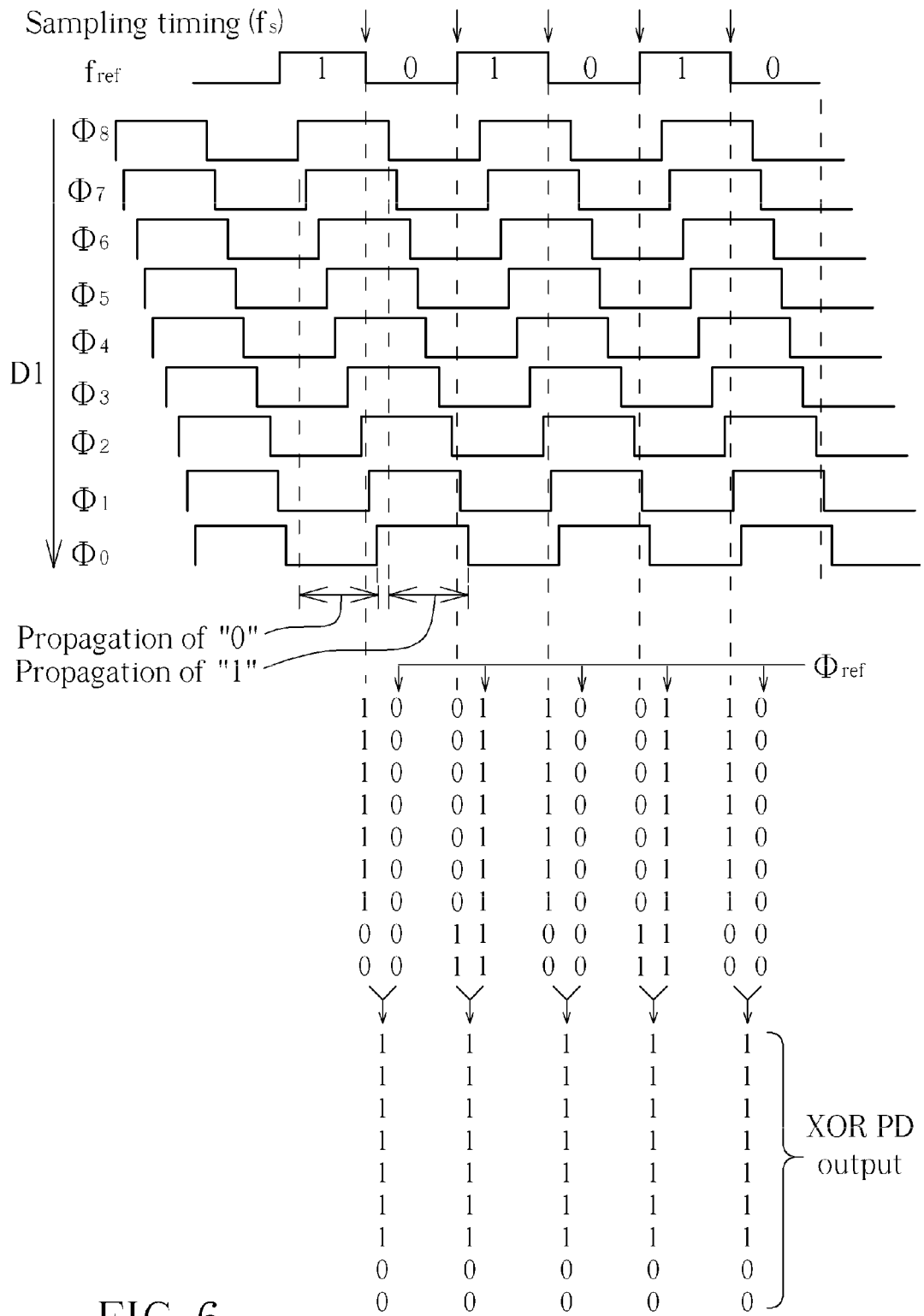
FIG. 6 is a diagram illustrating an original quantization output generated under a condition where no compensation is applied to the reference phase input used by an XOR PD according to a first exemplary embodiment of the present invention.

FIG. 6 is a diagram illustrating an original quantization output generated under a condition where no compensation is applied to the reference phase input $\phi_{ref}$ used by the XOR PD according to a first exemplary embodiment of the present invention. Suppose that the VCO 112 shown in FIG. 4 is a ring oscillator with 9 inverter stages $\phi_8$-$\phi_0$, the oscillator frequency $f_{osc}$ of the VCO 112 is locked to a reference frequency $\phi_{ref}$ of the reference clock with the initial setting of the reference phase input $\phi_{ref}$, and the oscillator frequency $f_{osc}$, the reference frequency $f_{ref}$, and the sampling frequency $f_s$ having the following relationship: $f_{osc}=f_{ref}=0.5*f_s$. Therefore, the sampling operation is performed twice in each clock cycle of the reference clock, and the edges of the multi-phase clocks generated from the ring oscillator would propagate twice in each clock cycle of the reference clock. As shown in FIG. 6, the sampling operation obtains bit sequences "111111100", "000000011", "111111100", "000000011", and "111111100", successively. To measure the propagation of "1" in the edge propagation direction D1, the shift register 414 outputs a bit sequence "000000000" representative of the reference phase input $\phi_{ref}$ to the PD 204. Besides, to measure the propagation of "0" in the edge propagation direction D1, the shift register 414 outputs a bit sequence "111111111" representative of the reference phase input $\phi_{ref}$ to the PD 204. As can be seen from FIG. 6, the shift register 414 is arranged to output the bit sequence "000000000" and the bit sequence "111111111", alternately. Thus, the PD 204 generates a thermometer code "111111100" as one XOR PD output (i.e., the quantization output Q_OUT), periodically. In other words, the number of 1's included in each thermometer code is 7.

Figures 7A, 7B:
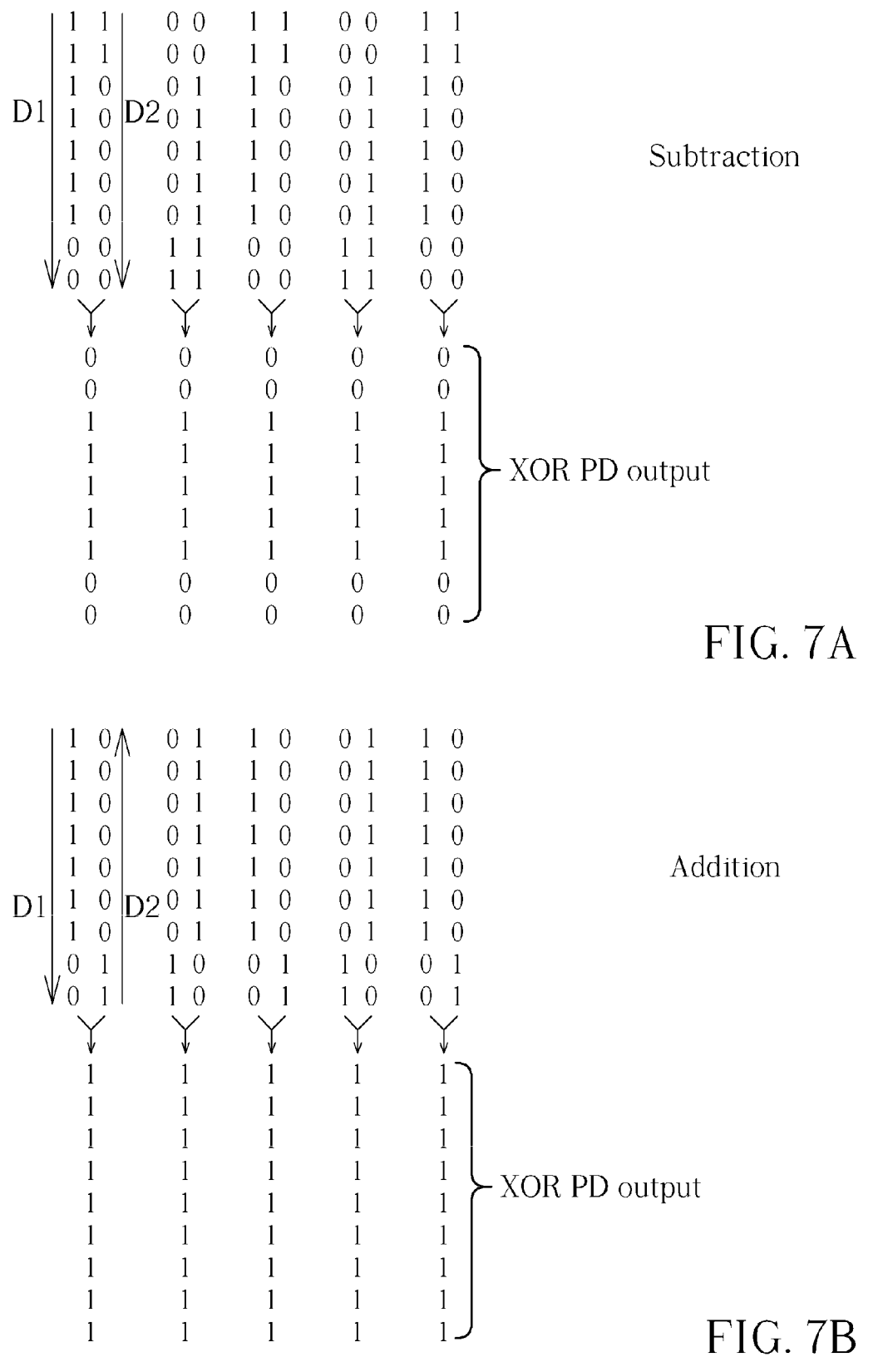

Please refer to FIG. 7A, which is a diagram illustrating an exemplary subtraction in the phase domain for adjusting the original XOR PD output shown in FIG. 6. In this exemplary embodiment, the control unit 412 makes the shift control upon the bit sequence "000000000" in the shift register 414 for shifting two bits in a bit-shifting direction identical to the edge propagation direction D1. Thus, the bit-shifted bit sequence becomes "110000000". Similarly, during the propagation of 0's, the control unit 412 makes the shift control upon the bit sequence "111111111" in the shift register 414 for shifting two bits in a bit-shifting direction identical to the edge propagation direction D1. Thus, the bit-shifted bit sequence during the propagation of 1's becomes "001111111" which is an inverted version of "110000000". As can be seen from FIG. 7A, the number of 1's included in each thermometer code is 5 (i.e., 5=7−2) now, which are the same in either of the propagation of 1's and the propagation of 0's.

Please refer to FIG. 7B, which is a diagram illustrating an exemplary addition in the phase domain for adjusting the original XOR PD output shown in FIG. 6. In this exemplary embodiment, the control unit 412 makes the shift control upon the bit sequence "000000000" in the shift register 414 for shifting two bits in a bit-shifting direction opposite to the edge propagation direction. Thus, the bit-shifted bit sequence becomes "000000011". Similarly, the control unit 412 makes the shift control upon the bit sequence "111111111" in the shift register 414 for shifting two bits in a bit-shifting direction opposite to the edge propagation direction. Thus, the bit-shifted bit sequence becomes "111111100" which is an inverted version of "000000011". As can be seen from FIG. 7B, the number of 1's included in each thermometer code is 9 (i.e., 9=7+2) now.

In above exemplary embodiment shown in FIG. 6, the oscillator frequency $f_{osc}$, the reference frequency $f_{ref}$, and the sampling frequency $f_s$ have the following relationship: $f_{osc}=f_{ref}=0.5*f_s$. However, this is not meant to be a limitation of the present invention. Please refer to FIG. 8, which is a diagram illustrating an original quantization output generated under a condition where no compensation is applied to the reference phase input $\phi_{ref}$ used by the XOR PD according to a second exemplary embodiment of the present invention. Suppose that the VCO 112 shown in FIG. 4 is a ring oscillator with 9 inverter stages, the oscillator frequency $f_{osc}$ of the VCO 112 is locked to a reference frequency fref of the reference clock with the initial setting of the reference phase input $\phi_{ref}$, and the oscillator frequency $f_{osc}$, the reference frequency $f_{ref}$, and the sampling frequency $f_s$ having the following relationship: $f_{osc}=f_{ref}=0.25*f_s$. Therefore, the sampling operation is performed 4 times in each clock cycle of the reference clock, and the edges of the multi-phase clocks generated from the ring oscillator would propagate twice in each clock cycle of the reference clock. To measure the propagation of "0" in the edge propagation direction D1, the shift register 414 successively outputs a bit sequence "111100000" and a bit sequence "111111111" to the PD 204. Besides, to measure the propagation of "1" in the edge propagation direction D1, the shift register 414 successively outputs a bit sequence "000011111" and a bit sequence "000000000" to the PD 204. As can be seen from FIG. 8, the shift register 414 is arranged to output the bit sequences "111100000", "111111111", "000011111", and "000000000", alternately. Thus, the PD 204 generates thermometer codes "110011111" and "111111100" as the XOR PD output (i.e., the quantization output Q_OUT), alternately. In other words, the number of 1's included in each thermometer code is 7.

Figure 8:
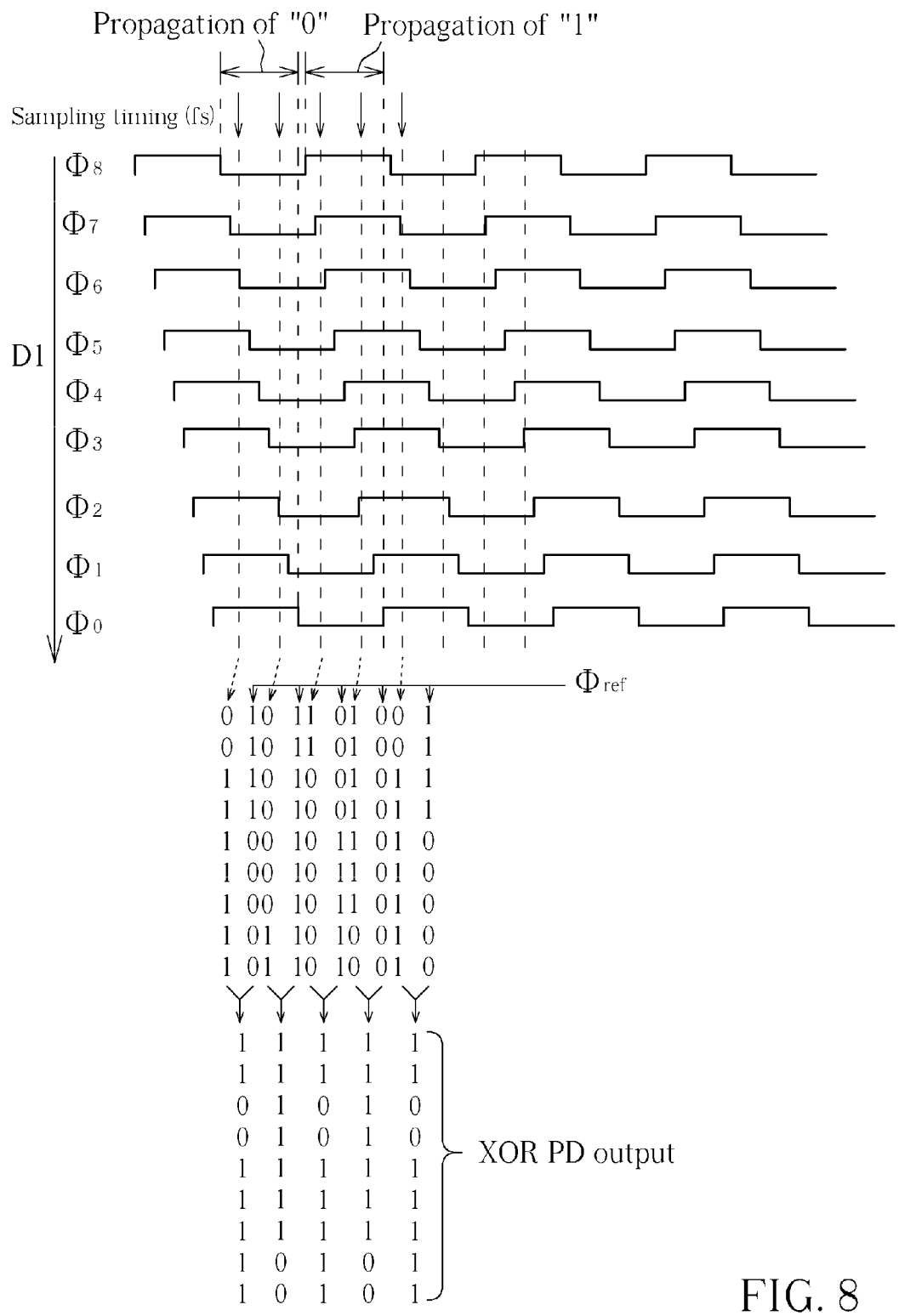
FIG. 8 is a diagram illustrating an original quantization output generated under a condition where no compensation is applied to the reference phase input used by an XOR PD according to a second exemplary embodiment of the present invention.
Figures 9A, 9B:
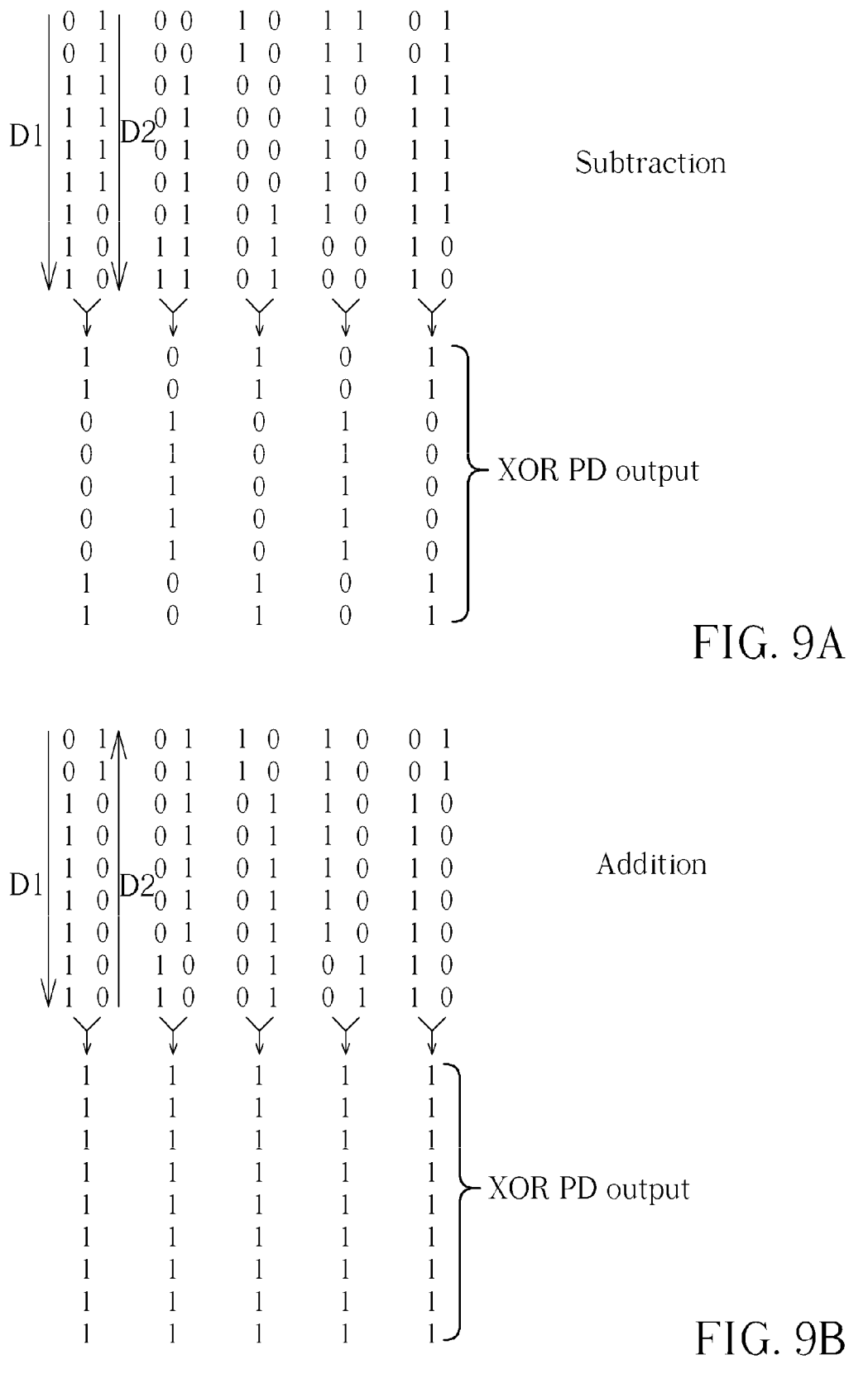

Please refer to FIG. 9A, which is a diagram illustrating an exemplary subtraction in the phase domain for adjusting the original XOR PD output shown in FIG. 8. In this exemplary embodiment, the control unit 412 makes the shift control upon the bit sequence "111100000" in the shift register 414 for shifting two bits in a bit-shifting direction identical to the edge propagation direction. Thus, the bit-shifted bit sequence becomes "111111000". Similarly, the control unit 412 further makes the shift control upon the bit sequences "111111111", "000011111" and "000000000" for shifting two bits in a bit-shifting direction identical to the edge propagation direction. Thus, the bit-shifted bit sequences become "001111111", "000000111", and "110000000", respectively. As can be seen from FIG. 9A, the number of 1's included in each thermometer code is 5 (i.e., 5=7−2) now.

Please refer to FIG. 9B, which is a diagram illustrating an exemplary addition in the phase domain for adjusting the original XOR PD output shown in FIG. 8. In this exemplary embodiment, the control unit 412 makes the shift control upon the bit sequence "111100000" in the shift register 414 for shifting two bits in a bit-shifting direction opposite to the edge propagation direction. Thus, the bit-shifted bit sequence becomes "110000000". Similarly, the control unit 412 further makes the shift control upon the bit sequences "111111111", "000011111", and "000000000" for shifting two bits in a bit-shifting direction opposite to the edge propagation direction. Thus, the bit-shifted bit sequences become "111111100", "001111111", and "000000011", respectively. As can be seen from FIG. 9B, the number of 1's included in each thermometer code is 9 (i.e., 9=7+2) now.

Figure 3:
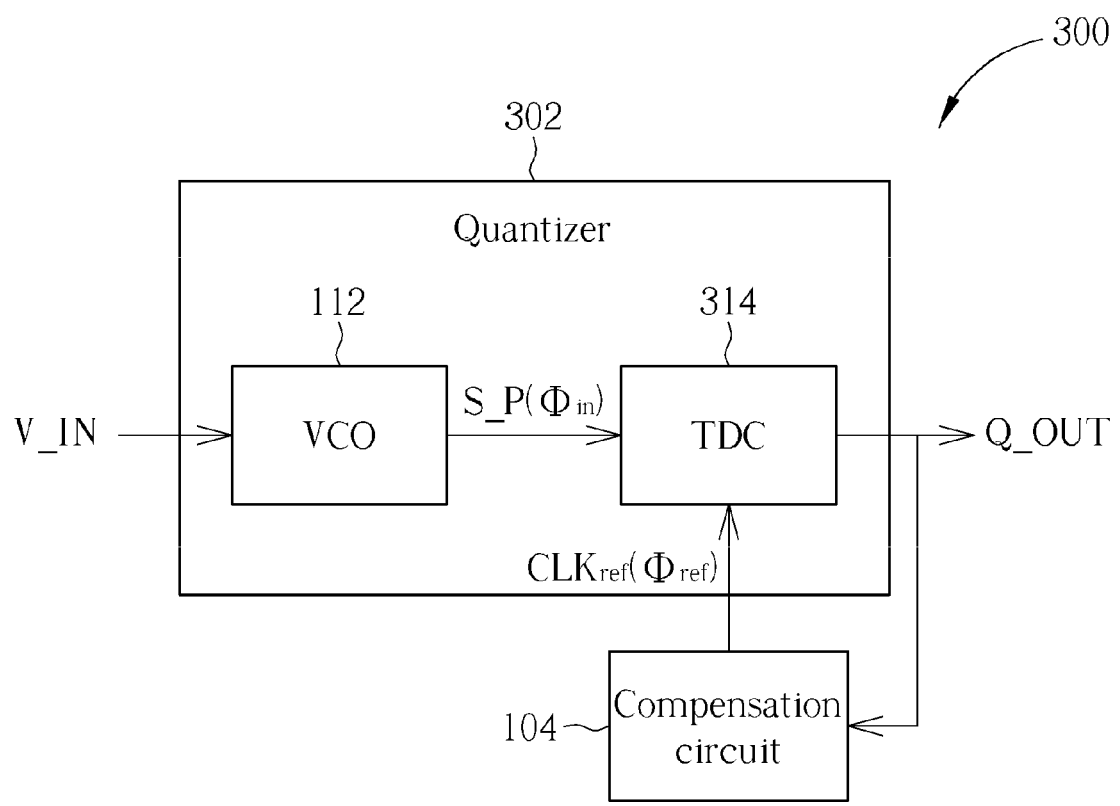
FIG. 3 is a diagram illustrating a second exemplary implementation of the quantization circuit shown in FIG. 1.
Figure 10:
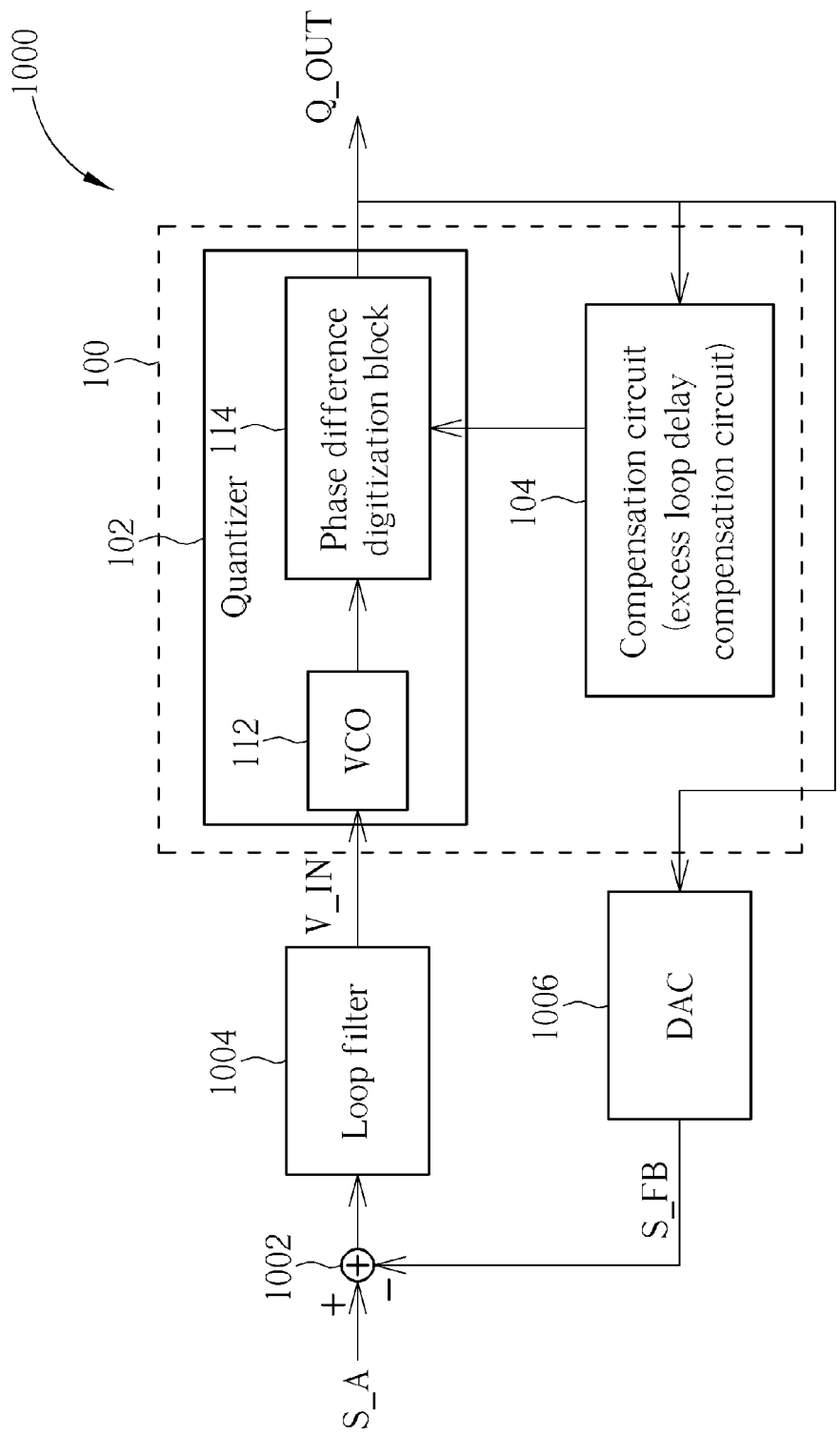
FIG. 10 is a block diagram illustrating a continuous-time delta-sigma analog-to-digital converter according to an exemplary embodiment of the present invention.

The aforementioned quantization circuit 100/200/300 may be employed in any application which requires quantization. By way of example, but not limitation, the aforementioned quantization circuit 100/200/300 may be implemented in a continuous-time delta-sigma analog-to-digital converter. Therefore, the compensation circuit 104 is utilized for offering the desired excess loop delay compensation in the phase domain. Please refer to FIG. 10, which is a block diagram illustrating a continuous-time delta-sigma analog-to-digital converter according to an exemplary embodiment of the present invention. The exemplary continuous-time delta-sigma analog-to-digital converter 1000 includes, but is not limited to, an adder 1002, a loop filter 1004, the aforementioned quantizer 102, the aforementioned compensation circuit 104 acting as an excess loop delay compensation circuit, and a digital-to-analog converter (DAC) 1006. The adder 1002 is arranged for subtracting a feedback signal S_FB from an analog input signal S_A. The loop filter 1004 is coupled to the adder 1002, and arranged for generating the input voltage V_IN according to an output of the adder 1002. As mentioned above, the quantizer 102 is a VCO-based quantizer, and includes the VCO 112 and the phase difference digitization block 114 which may be implemented by a combination of the sampler 202 and the PD 204 as shown in FIG. 2, or may be implemented by the TDC 314 as shown in FIG. 3. In this exemplary embodiment, the compensation circuit 104 acts as an excess loop delay compensation circuit used for applying compensation to the phase difference digitization block 114. The DAC 1006 is coupled between the phase difference digitization block 114 and the adder 1002, and arranged for generating the feedback signal S_FB according to the quantization output Q_OUT. It should be noted that only the components pertinent to features of the present invention are shown in FIG. 10 for simplicity and clarity. Adding other circuit components to the continuous-time delta-sigma analog-to-digital converter 1000 is feasible. For example, a delay unit may also be disposed in the feedback path between the quantizer 102 and the adder 1002. In a case where the quantization circuit 100 is implemented by the exemplary circuit structure shown in FIG. 4, an output of the delay unit 408 may be fed into the DAC 1006.

Briefly summarized, a quantization method employed by a quantization circuit may include following steps: utilizing a quantizer for generating a quantization output of an input voltage, comprising generating a phase signal according to the input voltage by a voltage-to-phase converter, and generating the quantization output according to a phase difference between a phase input of the phase signal and a reference phase input by performing a phase difference digitization; and applying compensation to the phase difference digitization according to the quantization output.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A quantization circuit, comprising:
   a quantizer, comprising:
      a voltage-to-phase converter, arranged for generating a phase signal according to an input voltage; and
      a phase difference digitization block, arranged for generating a quantization output according to a phase difference between a phase input of the phase signal and a reference phase input; and
   a compensation circuit, arranged for applying compensation to the phase difference digitization block by adjusting the reference phase input according to the quantization output.

2. The quantization circuit of claim 1, wherein the phase difference digitization block comprises:
   a sampler, arranged for sampling the phase input of the phase signal and accordingly generating a quantized phase input; and
   a phase detector, coupled to the sampler and arranged for generating the quantization output by comparing the quantized phase input and the reference phase input; and
   the compensation circuit is arranged for adjusting the reference phase input according to the quantization output.

3. The quantization circuit of claim 1, wherein the compensation circuit adjusts the reference phase input by bit-shifting a bit sequence of the reference phase input according to the quantization output.

4. The quantization circuit of claim 3, wherein the compensation circuit performs a subtraction in a phase domain by adjusting the reference phase input in a bit-shifting direction identical to an edge propagation direction of the phase signal.

5. The quantization circuit of claim 3, wherein the compensation circuit performs an addition in a phase domain by adjusting the reference phase input in a bit-shifting direction opposite to an edge propagation direction of the phase signal.

6. The quantization circuit of claim 1, wherein the phase difference digitization block is a time-to-digital converter (TDC).

7. A quantization method, comprising:
   utilizing a quantizer for generating a quantization output of an input voltage, comprising:
      generating a phase signal according to the input voltage; and
      generating the quantization output according to a phase difference between a phase input of the phase signal and a reference phase input by performing a phase difference digitization; and
   applying compensation to the phase difference digitization by adjusting the reference phase input according to the quantization output.

8. The quantization method of claim 7, wherein the step of performing the phase difference digitization comprises:
   sampling the phase input of the phase signal and accordingly generating a quantized phase input; and
   generating the quantization output by comparing the quantized phase and the reference phase input; and
   the step of applying compensation to the phase difference digitization comprises:
   adjusting the reference phase input according to the quantization output.

9. The quantization method of claim 7, wherein the step of applying compensation to the phase difference digitization comprises:
   bit-shifting a bit sequence of the reference phase input according to the quantization output.

10. The quantization method of claim 9, wherein the step of bit-shifting the bit sequence of the reference phase input comprises:
    performing a subtraction in a phase domain by adjusting the reference phase input in a bit-shifting direction identical to an edge propagation direction of the phase signal.

11. The quantization method of claim 9, wherein the step of bit-shifting the bit sequence of the reference phase input comprises:
    performing an addition in a phase domain by adjusting the reference phase input in a bit-shifting direction opposite to an edge propagation direction of the phase signal.

12. The quantization method of claim 7, wherein the phase difference digitization comprises a time-to-digital conversion.

13. A continuous-time delta-sigma analog-to-digital converter, comprising:
    an adder, arranged for subtracting a feedback signal from an analog input signal;
    a loop filter, arranged for generating an input voltage according to an output of the adder;
    a quantizer, comprising:
       a voltage-to-phase converter, arranged for generating a phase signal according to the input voltage; and
       a phase difference digitization block, arranged for generating a quantization output according to a phase difference between a phase input of the phase signal and a reference phase input;
    an excess loop delay compensation circuit, arranged for applying excess loop delay compensation to the phase difference digitization block according to the quantization output; and
    a digital-to-analog converter, arranged for generating the feedback signal according to the quantization output.

14. The continuous-time delta-sigma analog-to-digital converter of claim 13, wherein the phase difference digitization block comprises:
    a sampler, arranged for sampling the phase input of the phase signal and accordingly generating a quantized phase input; and
    a phase detector, arranged for generating the quantization output by comparing the quantized phase input and the reference phase input; and
    the excess loop delay compensation circuit is arranged for adjusting the reference phase input according to the quantization output.

15. The continuous-time delta-sigma analog-to-digital converter of claim 13, wherein the excess loop delay compensation circuit adjusts the reference phase input by bit-shifting a bit sequence of the reference phase input according to the quantization output.

16. The continuous-time delta-sigma analog-to-digital converter of claim 15, wherein the excess loop delay compensation circuit performs a subtraction in a phase domain by adjusting the reference phase input in a bit-shifting direction identical to an edge propagation direction of the phase signal.

17. The continuous-time delta-sigma analog-to-digital converter of claim 15, wherein the excess loop delay compensation circuit performs an addition in a phase domain by adjusting the reference phase input in a bit-shifting direction opposite to an edge propagation direction of the phase signal.

18. The continuous-time delta-sigma analog-to-digital converter of claim 13, wherein the phase difference digitization block is a time-to-digital converter (TDC).

* * * * *